US012690481B2

(12) United States Patent
Trunov et al.

(10) Patent No.: US 12,690,481 B2
(45) Date of Patent: Jul. 21, 2026

(54) ELECTRONIC DEVICE HAVING A SOLDERED JOINT BETWEEN A METAL REGION OF A SEMICONDUCTOR DIE AND A METAL REGION OF A SUBSTRATE

(71) Applicant: Infineon Technologies Austria AG, Villach (AT)

(72) Inventors: Kirill Trunov, Warstein (DE); Alexander Heinrich, Bad Abbach (DE); Konrad Roesl, Teublitz (DE); Arthur Unrau, Geseke (DE)

(73) Assignee: Infineon Technologies Austria AG, Villach (AT)

( * ) Notice: Subject to any disclaimer, the term of this patent is extended or adjusted under 35 U.S.C. 154(b) by 92 days.

(21) Appl. No.: 17/403,560

(22) Filed: Aug. 16, 2021

(65) Prior Publication Data

US 2021/0375824 A1 Dec. 2, 2021

Related U.S. Application Data

(62) Division of application No. 16/679,414, filed on Nov. 11, 2019, now Pat. No. 11,158,602.

(51) Int. Cl.
*H10W 72/00* (2026.01)
*B23K 1/00* (2006.01)
(Continued)

(52) U.S. Cl.
CPC ....... *H10W 72/0198* (2026.01); *B23K 1/0016* (2013.01); *B23K 20/026* (2013.01);
(Continued)

(58) Field of Classification Search
CPC ........... H01L 2224/16507; H01L 2224/16503; H10W 72/07255; H10W 72/2528
See application file for complete search history.

(56) References Cited

U.S. PATENT DOCUMENTS 4,843,190 A 6/1989 Verhoeven
8,354,692 B2 1/2013 Otremba
(Continued)

FOREIGN PATENT DOCUMENTS

CN 103094260 A 5/2013
CN 105706224 A 6/2016
(Continued)

OTHER PUBLICATIONS

Wang, Y., et al., "Challenges and Trends of High Power IGBT Module Packaging", IEEE Conference and Expo Transportation Electrification Asia-Pacific, Aug. 31, 2014, pp. 1-7.
(Continued)

*Primary Examiner* — Amar Movva
(74) *Attorney, Agent, or Firm* — Murphy, Bilak & Homiller, PLLC

(57) ABSTRACT
An electronic device includes: a first semiconductor die having a metal region; a substrate having a plurality of metal regions; a first soldered joint between the metal region of the first semiconductor die and a first metal region of the substrate, the first soldered joint having one or more inter-metallic phases throughout the entire soldered joint, each of the one or more intermetallic phases formed from a solder preform diffused into the metal region of the first semiconductor die and the first metal region of the substrate; and a second semiconductor die soldered to the first or different metal region of the substrate.

13 Claims, 12 Drawing Sheets

(51) Int. Cl.
    *B23K 20/02*       (2006.01)
    *H10W 72/20*      (2026.01)
    *H10W 90/00*      (2026.01)

(52) U.S. Cl.
    CPC . *H10W 72/07255* (2026.01); *H10W 72/2528*
        (2026.01); *H10W 90/00* (2026.01); *H10W*
            *72/07331* (2026.01); *H10W 72/07334*
        (2026.01); *H10W 72/07336* (2026.01); *H10W*
                        *72/07636* (2026.01)

(56)                      References Cited

U.S. PATENT DOCUMENTS

| | | | |
|---|---|---|---|
| 11,798,924 | B2 | 10/2023 | Trunov et al. |
| 2007/0166877 | A1 | 7/2007 | Otremba |
| 2007/0266558 | A1 | 11/2007 | Otremba |
| 2008/0014460 | A1 | 1/2008 | Riedl |
| 2008/0164488 | A1 | 7/2008 | Ikeda et al. |
| 2009/0236686 | A1* | 9/2009 | Shim ...................... H01L 21/568 |
| | | | 257/E21.705 |
| 2011/0017803 | A1 | 1/2011 | Guth et al. |
| 2011/0075451 | A1 | 3/2011 | Bayerer et al. |
| 2011/0220704 | A1 | 9/2011 | Liu et al. |
| 2012/0305632 | A1 | 12/2012 | Ross et al. |
| 2013/0009295 | A1 | 1/2013 | Otremba |
| 2013/0049204 | A1* | 2/2013 | Oeschler ........... H01L 23/49811 |
| | | | 257/772 |
| 2013/0168856 | A1 | 7/2013 | Wang et al. |
| 2013/0200502 | A1 | 8/2013 | Nikitin et al. |
| 2013/0200532 | A1 | 8/2013 | Otremba et al. |
| 2014/0264798 | A1 | 9/2014 | Otremba et al. |
| 2015/0115452 | A1* | 4/2015 | Yoon ...................... H01L 24/83 |
| | | | 228/256 |
| 2015/0228616 | A1 | 8/2015 | Palm et al. |
| 2015/0279804 | A1 | 10/2015 | Raravikar et al. |
| 2016/0126197 | A1* | 5/2016 | Matoy ...................... H01L 24/83 |
| | | | 257/773 |
| 2016/0126211 | A1 | 5/2016 | Hohlfeld et al. |
| 2016/0219720 | A1 | 7/2016 | Strogies et al. |
| 2016/0358890 | A1 | 12/2016 | Heinrich et al. |
| 2017/0025223 | A1 | 1/2017 | Bultitude et al. |
| 2017/0207123 | A1 | 7/2017 | Mischitz et al. |
| 2017/0271298 | A1 | 9/2017 | Heinrich et al. |
| 2017/0282287 | A1 | 10/2017 | Larsson et al. |
| 2020/0152587 | A1 | 5/2020 | Yu et al. |

FOREIGN PATENT DOCUMENTS

| | | |
|---|---|---|
| CN | 109534842 A | 3/2019 |
| DE | 10201781 A1 | 8/2003 |
| DE | 102007012689.3 B3 | 7/2008 |
| DE | 102017004626 A1 | 11/2018 |
| JP | 2008191349 A | 8/2008 |
| KR | 20080008375 A | 1/2008 |
| WO | 2018192987 A1 | 10/2018 |

OTHER PUBLICATIONS

Xingke, Zhao, "Modern Welding and Joining Technologies", ISBN 978-7-5024-7255-9, https://img.duxiu.com/n/jpgfs/book/base/14207415/231013e993f44d83b97887bb43833e33/9a72f796336f17fa040b9b0c3eb93011.shtml?uf=1&t=; Jun. 1, 2016, pp. 1-7, English abstract attached.

Yuhua, Chen, et al., "Advanced Connecting Technologies and Applications", Chapter 10, ISBN 978-7-5165-1985-1, Xian jin Uan jie Ji shu Ji Ying yang, https://img.duxiu.com/n/jpgfs/book/base/14665871/cb7847050dfb4c8aad50eaf3d32ebb8f/2bbd82dcf271ef42a448af46a7e99e72.shtml?uf=1&t=1, Jul. 1, 2019, pp. 1-6, English abstract attached.

Zhang, Qiyan, et al., "Manual of Brazing and soldering", https://img.duxiu.com/n/jpgfs/book/         base/11002932/367c4a7a62924a7aa1c5118a45ad107c/65e415f6147bfa84d2eaf849c8f5e71f.shtml?uf=1&t=1 . . . , Jan. 31, 1999, pp. 1-7, English abstract attached.

* cited by examiner

ELECTRONIC DEVICE HAVING A SOLDERED JOINT BETWEEN A METAL REGION OF A SEMICONDUCTOR DIE AND A METAL REGION OF A SUBSTRATE

BACKGROUND

Thermal and electrical performance play an increasing role in the advancement of semiconductor technologies. These factors, coupled with miniaturization and increased performance, demand a high-performance die (chip) attach process and material. Diffusion soldering is one such die attach process.

Diffusion soldering involves sputtering a thin layer of solder material onto the backside of a semiconductor wafer. The deposition of the solder material represents a significant fraction of the overall wafer cost. In addition, a high force is used during the die attach process to achieve a form-fit interconnect, as the sputtered solder layer is thin and the lead frame to which the devices are attached has a defined curvature.

The diffusion soldering process described above also requires specialized equipment, including a bond force unit for applying the high force to the devices to achieve a form-fit interconnect. Furthermore, mechanical pressure is applied individually to each die and must be maintained until a significant portion of the solder has solidified isothermally, limiting the throughput of the die attach process. In addition, the soldering temperature must be high to enable a full reaction and isothermal solidification in a short time.

Thus, there is a need for an improved batch diffusion soldering process.

SUMMARY

According to an embodiment of a method of batch soldering, the method comprises: forming a first soldered joint between a metal region of a first semiconductor die and a first metal region of a substrate using a first solder preform via a soldering process which does not apply pressure directly to the first semiconductor die, the first solder preform having a maximum thickness of 30 μm and a lower melting point than both the metal region of the first semiconductor die and the first metal region of the substrate; setting a soldering temperature of the soldering process so that the first solder preform melts and fully reacts with the metal region of the first semiconductor die and the first metal region of the substrate to form one or more intermetallic phases throughout the entire first soldered joint, each of the one or more intermetallic phases having a melting point above the melting point of the preform and the soldering temperature; and soldering a second semiconductor die to the first or different metal region of the substrate, without applying pressure directly to the second semiconductor die.

The second semiconductor die may be soldered to the substrate via the same or different soldering process used to form the first soldered joint.

Separately or in combination, soldering the second semiconductor die to the substrate may comprise forming a second soldered joint between a metal region of the second semiconductor die and the first or different metal region of the substrate using the first solder preform or a second solder preform, via the same soldering process used to form the first soldered joint and without applying pressure directly to the second semiconductor die.

Separately or in combination, the soldering temperature of the soldering process may be set so that the solder preform used to form the second soldered joint melts and fully reacts with the metal region of the second semiconductor die and the first or different metal region of the substrate during the soldering process, to form one or more intermetallic phases throughout the entire second soldered joint.

Separately or in combination, the second soldered joint may be formed using the second solder preform, the second solder preform may be thicker than the first solder preform, and the second soldered joint may be devoid of intermetallic phases in a middle part of the second soldered joint.

Separately or in combination, the second soldered joint may be formed using the second solder preform, and the second soldered joint may be between the metal region of the second semiconductor die and the first metal region of the substrate.

Separately or in combination, soldering the second semiconductor die to the substrate may comprise: applying a solder paste to a metal region of the second semiconductor die and/or to the first or different metal region of the substrate; and reflowing the solder paste to form a second soldered joint between the metal region of the second semiconductor die and the first or different metal region of the substrate, without applying pressure directly to the second semiconductor die.

Separately or in combination, the solder paste may be reflowed at the same time that the first soldered joint is formed.

Separately or in combination, the solder paste may be reflowed after the first soldered joint is formed, and the first soldered joint may have a melting point above a reflow temperature of the solder paste so that the first soldered joint does not melt during reflowing of the solder paste.

Separately or in combination, the method may further comprise soldering a connector to the substrate, without applying pressure directly to the connector.

Separately or in combination, soldering the connector to the substrate may comprise forming a soldered joint between the connector and the first or different metal region of the substrate using the first solder preform or a second solder preform, via the same soldering process used to form the first soldered joint and without applying pressure directly to the connector.

Separately or in combination, soldering the connector to the substrate may comprise: applying a solder paste to the connector and/or to the first or different metal region of the substrate; and reflowing the solder paste to form a soldered joint between the connector and the first or different metal region of the substrate, without applying pressure directly to the connector.

Separately or in combination, the method may further comprise soldering a third semiconductor die to a side of the first or the second semiconductor die facing away from the substrate, without applying pressure directly to the third semiconductor die.

Separately or in combination, soldering the third semiconductor die to the side of the first or the second semiconductor die facing away from the substrate may comprise forming a soldered joint between a metal region of the third semiconductor die facing the substrate and a metal region of the first or the second semiconductor die facing away from the substrate using an additional solder preform, and without applying pressure directly to the third semiconductor die.

Separately or in combination, soldering the third semiconductor die to the side of the first or the second semiconductor die facing away from the substrate may comprise: applying a solder paste to a metal region of the third semiconductor die facing the substrate and/or to a metal region of the first or the second semiconductor die facing away from the substrate; and reflowing the solder paste to form a soldered joint between the third semiconductor die and the first or the second semiconductor die, without applying pressure directly to the third semiconductor die.

Separately or in combination, the method may further comprise soldering a metal clip to a side of the first or the second semiconductor die facing away from the substrate, without applying pressure directly to the metal clip.

Separately or in combination, soldering the metal clip to the side of the first or the second semiconductor die facing away from the substrate may comprise forming a soldered joint between the metal clip and a metal region of the first or the second semiconductor die facing away from the substrate using an additional solder preform, and without applying pressure directly to the metal clip.

Separately or in combination, soldering the metal clip to the side of the first or the second semiconductor die facing away from the substrate may comprise: applying a solder paste to the metal clip and/or to a metal region of the first or the second semiconductor die facing away from the substrate; and reflowing the solder paste to form a soldered joint between the metal clip and the first or the second semiconductor die, without applying pressure directly to the metal clip.

According to an embodiment of an electronic device, the electronic device comprises: a first semiconductor die having a metal region; a substrate having a plurality of metal regions; a first soldered joint between the metal region of the first semiconductor die and a first metal region of the substrate, the first soldered joint having one or more intermetallic phases throughout the entire soldered joint, each of the one or more intermetallic phases formed from a solder preform diffused into the metal region of the first semiconductor die and the first metal region of the substrate; and a second semiconductor die soldered to the first or different metal region of the substrate.

A second soldered joint may be formed between a metal region of the second semiconductor die and the first or different metal region of the substrate. The second soldered joint may have one or more intermetallic phases throughout the entire second soldered joint or may be devoid of intermetallic phases in a middle part of the second soldered joint. A reflowed solder paste may form the second soldered joint.

Separately or in combination, the first semiconductor die may be a power semiconductor die and the second semiconductor die may be a passive semiconductor die or a logic semiconductor die.

Separately or in combination, the first semiconductor die may have a different thickness than the second semiconductor die.

Separately or in combination, the first soldered joint may laterally extend beyond one or more side faces of the first semiconductor die.

Separately or in combination, the electronic device may further comprise a connector attached to the first or different metal region of the substrate by a soldered joint having one or more intermetallic phases or a reflowed solder paste.

Separately or in combination, the electronic device may further comprise a third semiconductor die attached to a side of the first or the second semiconductor die facing away from the substrate by a soldered joint having one or more intermetallic phases or a reflowed solder paste.

Separately or in combination, the electronic device may further comprise a metal clip attached to a side of the first or the second semiconductor die facing away from the substrate by a soldered joint having one or more intermetallic phases or a reflowed solder paste.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a batch joining process for producing electronic devices, whereby one or more semiconductor dies processed at the same time are soldered to the same or different substrate using a thin solder preform without applying (mechanical) pressure directly to the semiconductor dies. Each thin solder preform used in the batch joining process is thin enough, e.g., at most 30 μm thick, so that the soldering temperature of the diffusion soldering process may be set so that each thin solder preform melts and fully reacts with metal regions of the corresponding semiconductor die and substrate to form one or more intermetallic phases throughout the entire soldered joint. Since (mechanical) pressure is not directly applied to the semiconductor dies during the diffusion soldering process, multiple semiconductor dies may be processed at the same time via the batch joining process and different joining materials may be used to accommodate different (e.g. passive and/or active) device types.

Figure 1:
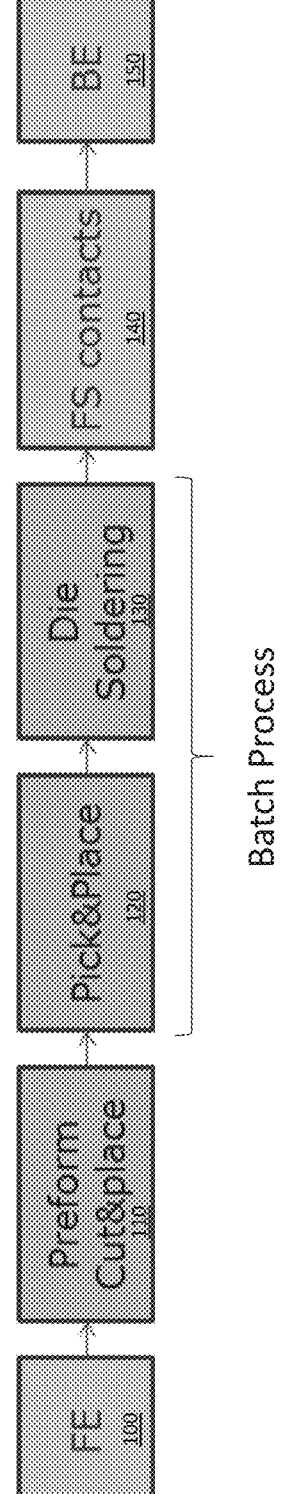
FIG. 1 illustrates a block diagram of an embodiment of a method of batch joining technique for semiconductor dies.

FIG. 1 illustrates an embodiment of the batch joining technique. According to this embodiment, standard front-end (FE) processing such as etching, grinding, polishing, structuring and/or metal deposition to for source, gate and drain contacts may be performed (Block 100) and one or more thin solder preforms cut and placed on a metal region of one or more semiconductor dies and/or on a metal region of one or more substrates (Block 110). Each thin solder preform can be stamped or cut from a reel of preform solder material as part of the batch joining technique, or can be a pre-cut preform, a pre-stamped preform, etc.

Each thin solder preform may be applied during die assembly or may be pre-applied to the substrate(s) or a semiconductor wafer. In one embodiment, a thin solder preform is applied to a front side or a back side of a semiconductor wafer which includes a plurality of semiconductor dies. After applying the thin solder preform to the semiconductor wafer, the semiconductor dies are singulated, e.g., by sawing, laser cutting, etching, etc. The thin solder preform may instead be applied after the die singulation process. For example, the semiconductor dies to be soldered using a thin solder preform may be heated and a thin solder preform may be applied to a front side or a back side of each heated semiconductor die. The thin solder preform may be stamped with the corresponding semiconductor die. In the case of pre-applying a thin solder preform to a substrate, the thin solder preform may be applied by roll cladding, pre-melting, printing and re-casting, etc. Each thin solder preform used as part of the batch joining technique may be cut by stamping, laser cutting, etching, etc. Thin solder preforms processed at the same time may have the same or different thicknesses depending on the types of semiconductor dies and substrates to be joined. More than one thin solder preform may be applied to the same or different substrate as part of the batch joining technique.

In general, the batch joining technique may be carried out free of flux, as the die attach process may be done in a vacuum environment under reducing atmosphere and with formic acid. This is also valid for printed thin solder preforms, where the paste may be free of flux, as the surfaces may be cleaned with formic acid during the batch joining technique. In each case, all semiconductor dies to be soldered at the same time may be joined to the same substrate, joined to individual substrates, or joined in respective groups to separate substrates via the batch joining technique.

For those semiconductor dies being attached to a substrate using a thin solder preform via diffusion soldering, each thin solder preform is a formed of solder that is thin and extremely uniform, e.g., such as a thin metal film or foil, and has a maximum thickness of 30 $\mu$m (microns), e.g., a maximum thickness of 15 $\mu$m, e.g., a maximum thickness of 10 $\mu$m or even thinner. Some semiconductor dies may be attached to the substrate using a thicker solder preform having a maximum thickness greater than 30 $\mu$m or using a solder paste. Connectors such as pins, rivets, metal plates, etc. also may be attached to the substrate using a thicker solder preform having a maximum thickness greater than 30 $\mu$m or using a solder paste.

In general, the term 'thin solder preform' as used herein means a solder preform having a maximum thickness of 30 $\mu$m and a lower melting point than the metal region of each semiconductor die and each metal region of the substrate to be joined by the thin solder preform. Such a thin solder preform fully reacts with the die backside metal and the substrate material during the diffusion soldering process, and the resulting soldered joint (bond line) formed between the semiconductor die and substrate has a high melting phase throughout the entire soldered joint. The term 'high melting phase' as used herein means an intermetallic phase having a melting point above the melting point of the preform and above the soldering temperature of the diffusion soldering process.

At thicknesses above 30 $\mu$m and for soft solder pastes, a high melting phase is not producible throughout the entire soldered joint in a reasonable amount of time, and thus the middle part of the resulting soldered joint will not be converted to an intermetallic compound and will instead remain at the original melting temperature. A soldered joint without a high melting phase throughout the entire soldered joint may be suitable for some types of semiconductor dies and connectors, and hence all dies and devices processed at the same time as part of the batch joining technique are not necessarily attached to the substrate using a thin solder preform. Some semiconductor dies and/or connectors may be attached to the substrate using a thicker solder preform having a maximum thickness greater than 30 $\mu$m or using a solder paste. For some applications, all semiconductor dies processed at the same time as part of the batch joining technique may be attached to the substrate using a thin solder preform.

The batch joining technique illustrated in FIG. 1 also includes picking and placing each semiconductor die to be processed at the same time on a corresponding substrate (Block 120). As described above, all semiconductor dies to be processed at the same time via the batch joining technique may be placed on the same substrate, placed on individual substrates, or placed on respective groups of separate substrates. Connectors such as pins, rivets, metal plates, etc. also may be attached to the substrate(s) using a thicker solder preform having a maximum thickness greater than 30 $\mu$m or using a solder paste, via the batch joining technique.

The batch joining technique illustrated in FIG. 1 also includes a batch die soldering process (Block 130). The batch die soldering process involves soldering each semiconductor die to the same or different metal region of a substrate. If the electronic device being produced includes connectors such as pins, rivets, metal plates, etc., the connectors may be attached to the substrate as part of the die soldering process. The die soldering process involves soldering each component (semiconductor dies and connectors if applicable) to the same or different metal region of a substrate without applying (mechanical) pressure directly to the components. This way, different types of semiconductor dies, die attach materials and connectors may be processed at the same time via the batch joining technique without having to accommodate different height tolerances.

For each semiconductor die being joined to a substrate by a thin solder preform, the corresponding soldered joint is formed by diffusion soldering without applying (mechanical) pressure directly to the semiconductor die. By using a thin solder preform that is at most 30 $\mu$m thick, the soldering temperature of the diffusion soldering process may be set so that the solder preform melts and fully reacts with the metal region of the corresponding semiconductor die and a metal region of the substrate to form one or more intermetallic phases throughout the entire soldered joint. Each intermetallic phase has a melting point above the melting point of the preform and the soldering temperature of the die soldering process.

By not applying direct pressure to the semiconductor dies and connectors as part of the soldering process, multiple dies and connectors may be soldered at the same time without concern for different thicknesses of the dies, substrates, connectors and/or die attach materials. This way, some semiconductor dies may be soldered using thin solder preforms, other semiconductor dies may be soldered using thicker solder preforms, and still other semiconductor dies and/or connectors may be soldered using solder paste. For each semiconductor die soldered using a thin solder preform, if the metal region of the semiconductor die and the metal region of the substrate comprise the same metal or metal alloy, a single intermetallic phase is formed throughout the entire soldered joint by the diffusion soldering process.

The joining technique illustrated in FIG. 1 may also include standard front side (FS) contact formation processing (Block 140), which may include forming electrically conductive structures for source and gate contacts and a solderable front side metallization and standard back-end (BE) processing (Block 150), which may include depositing a metallic layer stack for electrically connecting the drain contact. The front side contact formation processing and standard back-end processing may be performed using the same or different equipment, lines and/or sites as the batch die soldering process represented by Blocks 110 through 130.

In accordance with the batch joining technique illustrated in FIG. 1, a first soldered joint may be formed between a metal region of a first semiconductor die and a first metal region of a substrate using a first solder preform via the batch die soldering process (Block 130) and without applying (mechanical) pressure directly to the first semiconductor die. The first solder preform has a maximum thickness of 30 μm and a lower melting point than both the metal region of the first semiconductor die and the first metal region of the substrate. Further in accordance with the batch joining technique illustrated in FIG. 1, a soldering temperature of the soldering process may be set so that the first solder preform melts and fully reacts with the metal region of the first semiconductor die and the first metal region of the substrate to form one or more intermetallic phases throughout the entire first soldered joint. Each intermetallic phase has a melting point above the melting point of the preform and the soldering temperature. Further in accordance with the batch joining technique illustrated in FIG. 1, a second semiconductor die may be soldered to the first or different metal region of the substrate via the batch die soldering process (Block 130) used to form the first soldered joint and without applying pressure directly to the second semiconductor die. Additional semiconductor dies and/or connectors such as pins, rivets, metal plates, etc. also may be attached to the substrate via the batch die soldering process (Block 130) used to solder the first and second semiconductor dies.

FIGS. 2A through 2D illustrate an embodiment of Blocks 110 through 130 of the method shown in FIG. 1. While FIGS. 2A through 2D show a first semiconductor die 200 being joined to a first substrate 202 by diffusion soldering using a first thin solder preform 204, more than one semiconductor die is soldered at the same time to the same substrate, joined to individual substrates, or joined in respective groups to separate substrates as part of the batch joining technique, as previously explained herein. The diffusion soldering process shown in FIGS. 2A through 2D may be applied to each component being soldered via the batch joining technique using a solder preform.

Figure 2D:
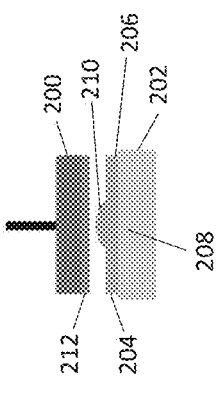
FIGS. 2A through 2D illustrate respective cross-sectional views of an embodiment of Blocks 110 through 130 of the method shown in FIG. 1.
Figure 2C:
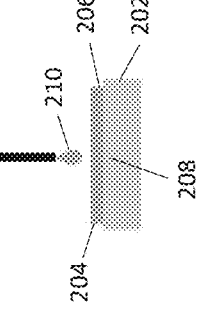
Figure 2B:
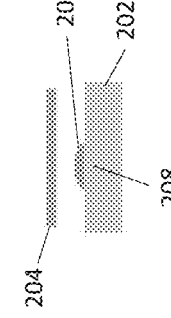
Figure 2A:
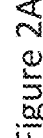

FIG. 2A shows a first liquid 206 being applied to the first substrate 202. In one embodiment, the first liquid 206 is a volatile, non-reactive liquid which keeps the first thin solder preform 204 in place on the first substrate 202 by surface tension. Any type of substrate to which a semiconductor die is typically joined may be used. For example, in one embodiment, the first substrate 202 is a leadframe or a metal clip having a metal die attach region 208 to which the first semiconductor die 200 is to be joined. The leadframe or metal clip may comprise Cu, Ni and/or Ag, for example. In another embodiment, the first substrate 202 comprises a ceramic and a metal layer attached to the ceramic and to which the first semiconductor die 200 is to be joined. In one embodiment, the metal layer comprises and/or is plated with Cu, Ni, Ag, Au, Pd, Pt, NiV, NiP, NiNiP, NiP/Pd, Ni/Au, NiP/Pd/Au, or NiP/Pd/AuAg. Still other types of metals/metal alloys and substrates may be used.

FIG. 2B shows the first thin solder preform 204 during placement on the first substrate 202 with the first liquid 206. The first liquid 206 maintains the position of the first thin solder preform 204 relative to the first substrate 202 by surface tension.

In one embodiment, the first thin solder preform 204 comprises Sn, Zn, In, Ga, Bi, Cd or any alloy thereof. For example, the first thin solder preform 204 may comprise Sn/Ag/Cu, Sn/Ag, Sn/Ag/Sb, Sn/Sb, Sn/Cu or Au80/Sn20. Still other types of thin solder preforms may be used. Alternatively, the first thin solder preform 204 may be applied to the first semiconductor die 200 instead of the first substrate 202. In this case, the first substrate 202 in FIG. 2B instead would be the first semiconductor die 200 or a semiconductor wafer from which the first die 200 is produced. For example, the first thin solder preform 204 may be applied to a front side or a back side of a semiconductor wafer which includes the first semiconductor die 200 and a plurality of additional semiconductor dies, or may be applied to the front side or back side of the first semiconductor die 200 after the die singulation process, both as previously described herein.

FIG. 2C shows a second liquid 210 being applied to the first thin solder preform 204. In one embodiment, the second liquid 210 is a volatile, non-reactive liquid which keeps the first semiconductor die 200 in place on the first thin solder preform 204 by surface tension. The first and second liquids 206, 210 may be the same or different type of liquid.

FIG. 2D shows the first semiconductor die 200 during placement on the first thin solder preform 204 with the second liquid 210. The second liquid 210 maintains the position of the first semiconductor die 200 relative to the first thin solder preform 204 by surface tension. A clamping mechanism (not shown) may be used to handle the first thin solder preform 204, to transport the assembly to a diffusion soldering oven.

A soldered joint is then formed between a metal region 212 of the first semiconductor die 200 facing the first substrate 202 and a metal region 208 of the first substrate 202 via a diffusion soldering process and without applying (mechanical) pressure directly to the first semiconductor die 200. The metal region 212 of the first semiconductor die 200 may be a metal layer applied to the back side or front side of the first semiconductor die 200. In one embodiment, the metal region 212 of the first semiconductor die 200 comprises and/or is plated with Cu, Ni, Ag, Au, Pd, Pt, NiV, NiP, NiNiP, NiP/Pd, Ni/Au, NiP/Pd/Au, NiP/Pd/AuAg, NiV/Ag, NiV/Au, or NiSi/Ag. The metal region 212 may be a terminal of the first semiconductor die 200, e.g., a load or control terminal in the case of a power transistor die such as a power MOSFET (metal-oxide semiconductor field-effect transistor), IGBT (insulated gate bipolar transistor), HEMT (high electron mobility transistor), etc., a control or I/O (input/output) terminal in the case of a logic die such as a gate driver, microcontroller, memory, etc., a terminal of a passive die such as an inductor or capacitor die, etc.

The metal region 212 of the first semiconductor die 200 and the metal region 208 of the first substrate 202 to be joined together by diffusion soldering process and the first thin solder preform 204 may comprise the same or different metal/metal alloy. If the metal regions 212, 208 joined by the first thin solder preform 204 comprise the same metal or metal alloy as the first thin solder preform 204, a single intermetallic phase is formed throughout the entire soldered joint formed between the first die 200 and first substrate 202, as previously explained herein. For example, if the metal region 212 of the first semiconductor die 200 and the metal region 208 of the first substrate 202 to be joined both comprise Cu or the same Cu-rich alloy, Cu will dissolve via the liquified preform material during the diffusion soldering process until a certain concentration is reached, at which point the joint solidifies. The resulting Cu-based intermetallic phase will not melt again at the solder temperature of the diffusion soldering process. The same applies for other types of common die and substrate metallization such as Ni-rich and Ag-rich alloys, for example.

If the metal region 212 of the first semiconductor die 200 and the metal region 208 of the first substrate 202 comprise a different metal/metal alloy, a plurality of intermetallic phases are formed throughout the entire soldered joint. In either case, the first thin solder preform 204 fully reacts with the die metal 212 and the substrate metal 208 during the diffusion solder process so that the soldered joint formed between the first die 200 and first substrate 202 has a high melting phase throughout the entire soldered joint.

Figure 3:
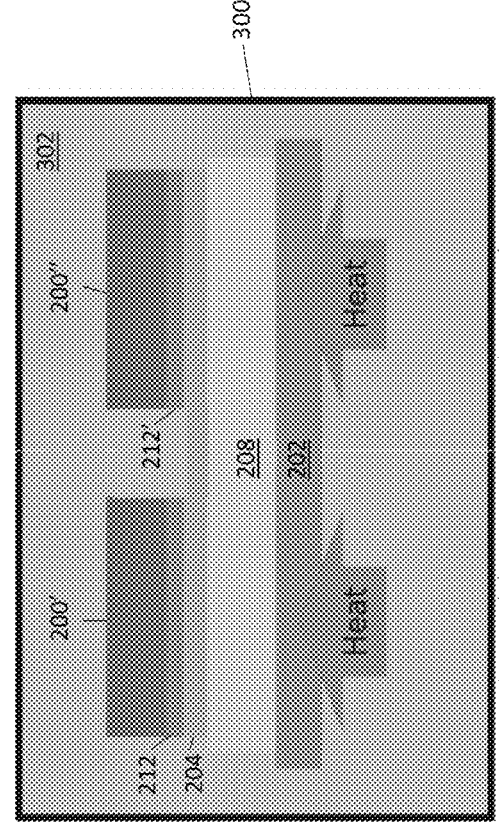
FIGS. 3 through 5 illustrate respective cross-sectional views of additional embodiments of Block 130 of the method shown in FIG. 1.

FIG. 3 illustrates an embodiment of the batch joining technique represented by Blocks 110 through 130 in FIG. 1. FIG. 3 shows first and second semiconductor dies 200', 200" being joined to a metal region 208 of a substrate 202 by the same soldering process. In one embodiment, the first and second semiconductor dies 200', 200" are both power semiconductor dies. In another embodiment, the first semiconductor die 200' is a power semiconductor die such as a power MOSFET, IGBT, HEMT, etc. and the second semiconductor die 200" is a passive semiconductor die such as an inductor or capacitor die, etc., or a logic semiconductor die such as a gate driver, microcontroller, memory, etc.

In FIG. 3, the second semiconductor die 200" is soldered to the substrate 202 using the same thin solder preform 204 used to join the first semiconductor die 200" to the substrate 202. According to this embodiment, both the first semiconductor die 200' and the second semiconductor die 200" are joined to the substrate 202 by a respective soldered joint having one or more intermetallic phases present throughout the entire soldered joint.

Formic acid 302 may be introduced into the vacuum oven 300 as part of the batch die soldering process (Block 130). The formic acid 302 removes oxidation from the substrate 202, each die metallization 212', 212" and the thin solder preform 204, thereby increasing wettability of each die metallization 212', 212" and the substrate metallization 208 and completely filling the space between the dies 200', 200" and substrate 202. The temperature of the vacuum oven 300 is increased under vacuum conditions to the soldering temperature for a duration over which the thin solder preform 204 melts and fully reacts with the corresponding die metallization 212', 212" and the substrate metallization 208 to form one or more intermetallic phases throughout the corresponding entire soldered joint. The batch die soldering process is performed without applying (mechanical) pressure directly to the semiconductor dies 200', 200". With this approach, standard diffusion soldering equipment may be used without redesign.

No squeeze out of solder material occurs from under the semiconductor dies 200', 200" during the batch die soldering process, since no (mechanical) pressure is applied directly to the semiconductor dies 200', 200". If (mechanical) pressure were applied to the semiconductor dies 200', 200" as is typically done during diffusion soldering, bubbles of liquid solder material would squeeze out from under the semiconductor dies 200', 200", yielding a scalloped like structure along the periphery of each die 200', 200". With the batch die soldering process described herein, there may be some capillary effect along the edge of the semiconductor dies 200', 200", but the capillary effect will be uniformly defined and the same around the entire periphery of the dies 200', 200". This means that the soldered joint does not exceed the lateral (length and width) dimensions of the semiconductor dies 200', 200", and has the same length-to-width aspect ratio as the semiconductor dies 200', 200". Also, as previously described herein, the respective die metallization 212', 212" and the substrate metallization 208 may comprise the same metal or metal alloy so that a single intermetallic phase is present throughout the corresponding entire soldered joint.

Figure 4:
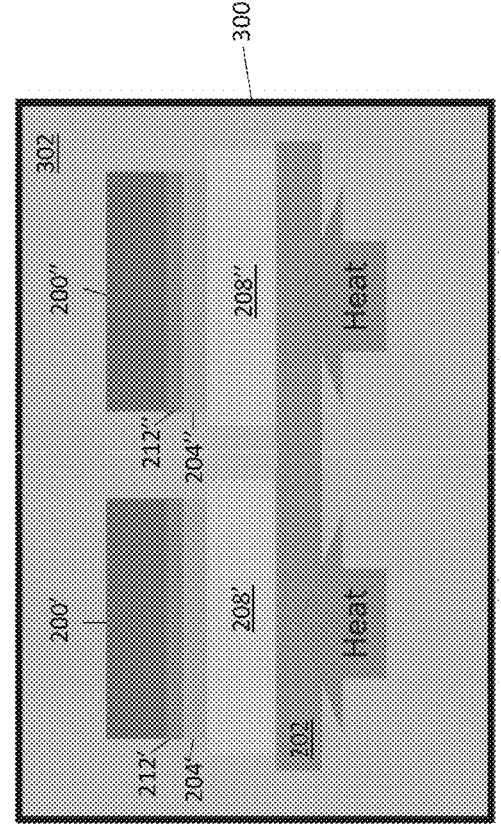

FIG. 4 illustrates another embodiment of the batch joining technique represented by Blocks 110 through 130 in FIG. 1. The embodiment illustrated in FIG. 4 is similar to the embodiment illustrated in FIG. 3. Different, however, the first and second semiconductor dies 200', 200" are being joined to different metal regions 208', 208" of the substrate 202 by the same soldering process. According to this embodiment, the first and second semiconductor dies 200', 200" may be soldered to different metal regions 208', 208" of the substrate 202 by separate thin solder preforms 204', 204". The soldering temperature of the soldering process may be set so that the thin solder preform 204" used to form the second soldered joint melts and fully reacts with the metal region 212" of the second semiconductor die 200" and the corresponding metal region 208" of the substrate 202 during the soldering process, to form one or more intermetallic phases throughout the entire soldered joint between the second die 200" and the substrate 202.

The second semiconductor die 200" may instead be soldered to the substrate 202 using a thicker solder preform having a maximum thickness greater than 30 μm. In this case, a high melting phase is not producible throughout the entire soldered joint in a reasonable amount of time and the resulting soldered joint between the second die 200" and the substrate 202 is devoid of intermetallic phases in a middle part of the soldered joint.

Figure 5:
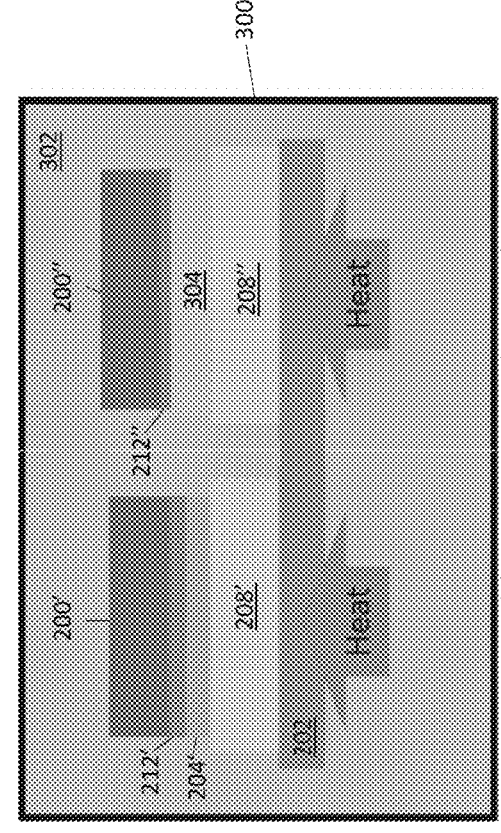

FIG. 5 illustrates another embodiment of the batch joining technique represented by Blocks 110 through 130 in FIG. 1. The embodiment illustrated in FIG. 5 is similar to the embodiment illustrated in FIG. 4. Different, however, the second semiconductor die 200" is soldered to the substrate 202 using a solder paste 304 instead of a solder preform. The solder paste 304 may be applied to the metal region 212" of the second semiconductor die 200" and/or to the corresponding metal region 308" of the substrate 202. The solder paste 304 is then reflowed to form a second soldered joint between the metal region 212" of the second semiconductor die 200" and the corresponding metal region 308" of the substrate 202, without applying (mechanical) pressure directly to the second semiconductor die 200". The solder paste 304 may be reflowed at the same time that the soldered joint is formed between the first semiconductor die 200' and the substrate 202. If the soldered joint between the first semiconductor die 200' and the substrate 202 has a melting point above a reflow temperature of the solder paste 304, the solder paste 304 may instead be reflowed after the soldered joint is formed between the first semiconductor die 200' and the substrate 202 so that the soldered joint between the first semiconductor die 200' and the substrate 202 does not melt during reflowing of the solder paste 304. FIG. 5 shows the second semiconductor die 200" soldered to a different metal region 308" of the substrate 202 than the first semiconductor die 200'. The second semiconductor die 200" may instead be soldered to the same metal region 308' of the substrate 202 as the first semiconductor die 200'.

In either case, the embodiment illustrated in FIG. 5 combines diffusion soldering with standard soldering, e.g., by using a thin solder preform 204' to achieve a diffusion soldered joint and using a solder paste 304 or a thicker solder preform to achieve a standard soldered joint. Such an approach may be beneficial for yield purposes. For example, diffusion soldered joints may be used for devices having a high lifetime reliability requirement and standard soldered joints may be used for devices having a lower lifetime reliability requirement. Passive devices and low power devices may also use standard soldering, and high power and high reliability devices may use diffusion soldering.

In FIGS. 3 through 5, the first and second semiconductor dies 200', 200" are batch soldered to a substrate 200 without applying (mechanical) pressure directly to either semiconductor die 200' 200". More than two semiconductor dies 200 may be joined to the substrate 202 via the batch joining technique, and additional components such as connectors like pins, rivets, metal plates, etc. also may be attached to the substrate 202 using a thin solder preform, a thicker solder preform having a maximum thickness greater than 30 µm or a solder paste as part of the batch joining technique.

Figures 6A, 6B:
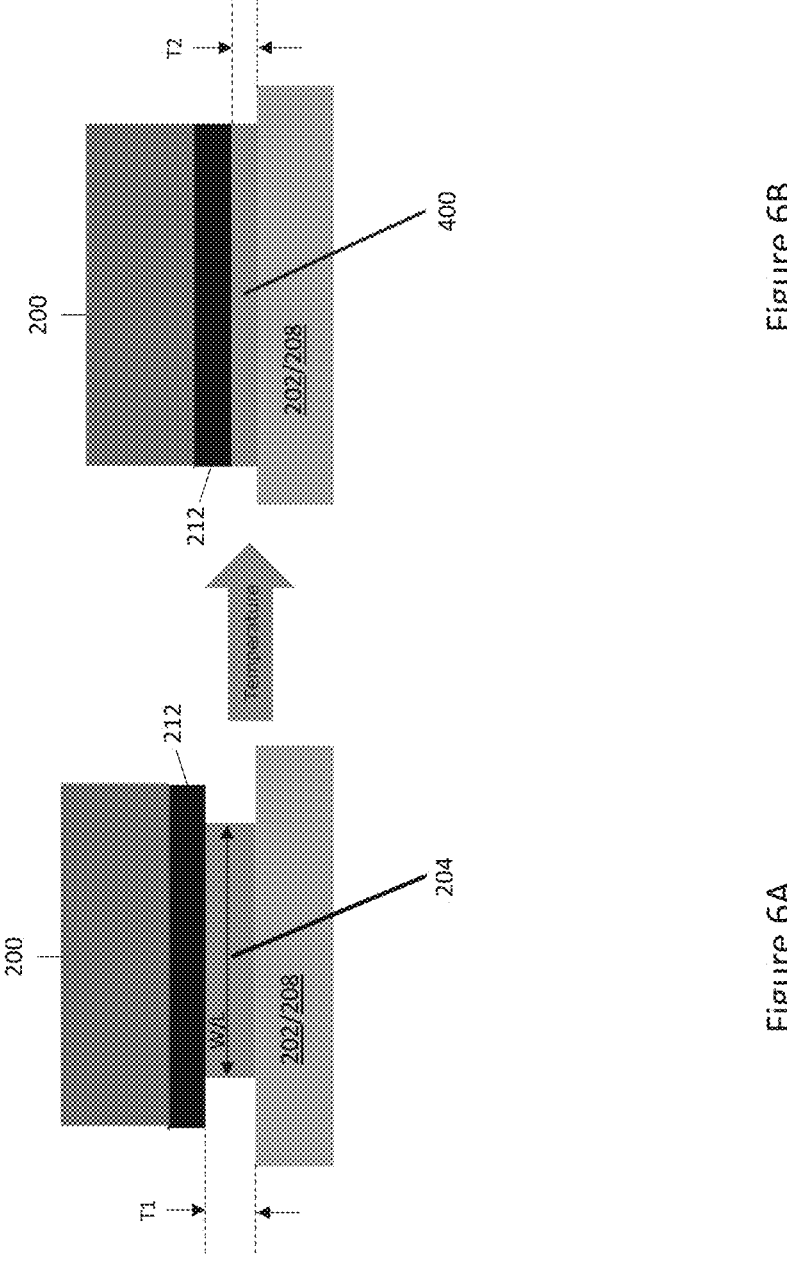
FIGS. 6A and 6B illustrate respective cross-sectional views of another embodiment of Blocks 110 through 130 of the method shown in FIG. 1.

FIGS. 6A and 6B illustrate another embodiment of Blocks 110 through 130 of the method shown in FIG. 1. According to this embodiment, the thin solder preform 204 used to join the metal region 212 of a semiconductor die 200 to the metal region 208 of a substrate 202 has a smaller width and/or a smaller length (W/L) than the metal region 212 of the die 200 prior to the batch soldering process, as shown in FIG. 5A. The thin solder preform 204 melts and spreads over the entire metal region 212 of the semiconductor die 200 during the batch soldering process, so that the resulting soldered joint 400 has a thickness (T2) which is less than the initial maximum thickness (T1) of the solder preform 204, as shown in FIG. 6B. This way, a soldered joint 400 can be realized which is thinner than the thinnest available solder preform 204.

Provisioning the die attach material 204 independent from the die metallization 212 yields several advantages. A thin solder preform 204 may be chosen smaller than lateral dimensions of the semiconductor die 200, e.g., as illustrated in FIGS. 6A and 6B, to enable narrow design rule/low clearance. Furthermore, the use of formic acid 302 as part of the batch soldering process provides excellent wetting of thin solder preforms 204 to a substrate 202, completely filling space between the semiconductor dies 200 and the substrate 202. Also with this approach, the type of solder preform/material may be exchanged easily without requiring modifications to the joining/diffusion soldering process.

Described next are additional embodiments of electronic devices produced by the batch joining technique described herein.

Figure 7:
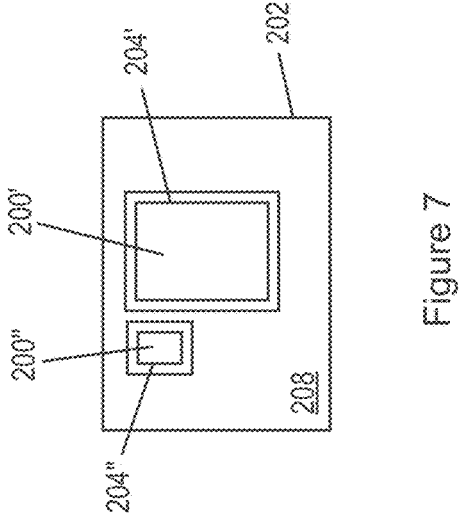

FIG. 7 shows an embodiment of an electronic device in which first and second semiconductor dies 200', 200" are soldered to the same substrate 202 using separate solder preforms 204', 204". According to this embodiment, the semiconductor dies 200', 200" are joined to the same metal region 208 of the substrate 202 via respective soldered joints formed between the metal region (out of view) of the corresponding semiconductor die 200', 200" and the metal region 208 of the substrate 202. At least one of the solder preforms 204', 204" is a thin preform so that the corresponding soldered joint has one or more intermetallic phases throughout the entire soldered joint. In one embodiment, the first semiconductor die 200' is a power semiconductor die such as a power MOSFET, IGBT, HEMT, etc. and the second semiconductor die 200" is a passive semiconductor die such as an inductor or capacitor die, etc., or a logic semiconductor die such as a gate driver, microcontroller, memory, etc.

Figure 8:
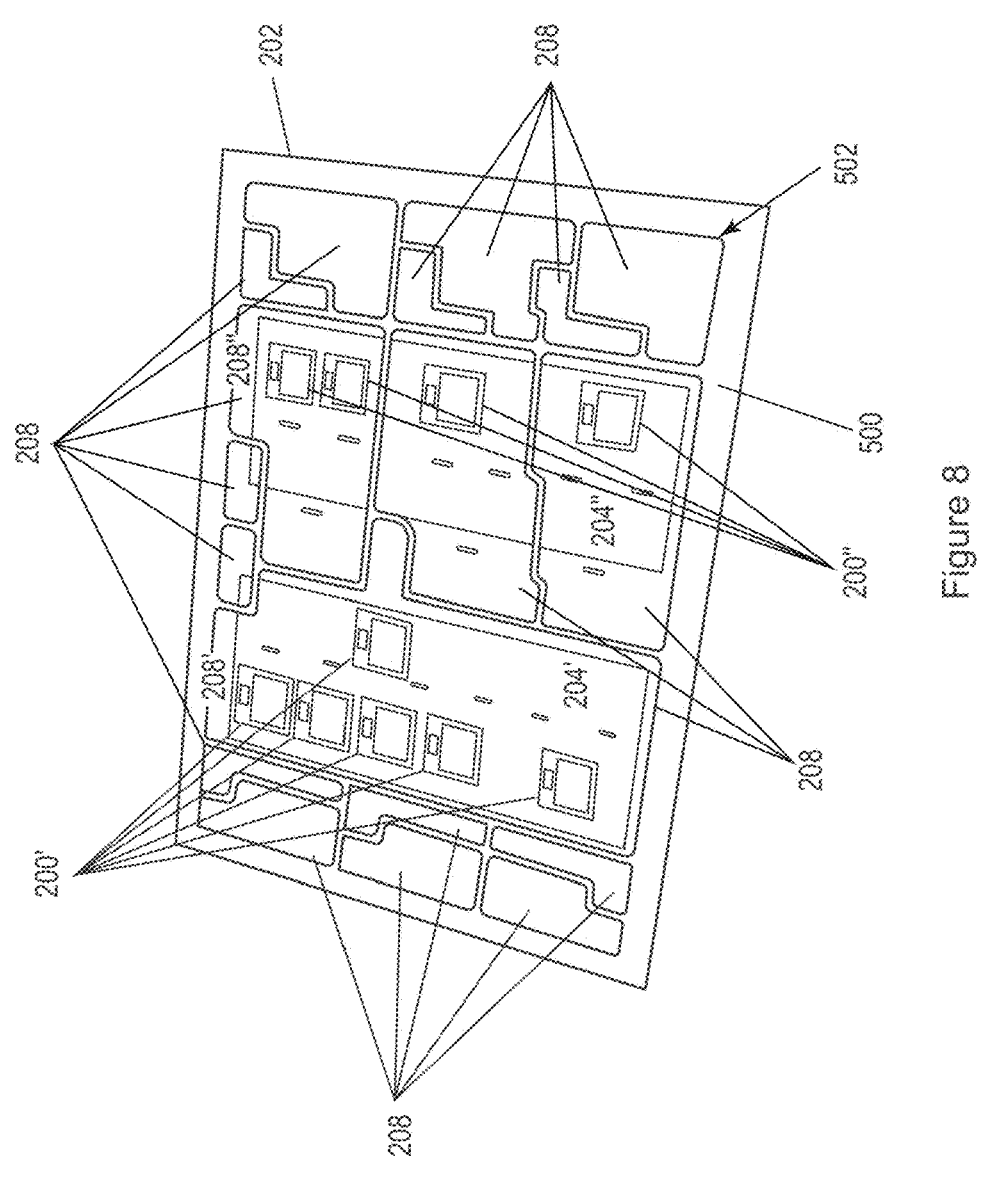
FIGS. 7 through 15 illustrate respective cross-sectional views of additional embodiments of electronic devices produced in accordance with the method shown in FIG. 1.

FIG. 8 shows an embodiment of an electronic device in which the substrate 202 has a plurality of metal regions 208 separated from one another. For example, the substrate 202 may comprise a ceramic 500 and a metal layer 502 attached to the ceramic 500 and into which the plurality of separated metal regions 208 is patterned. In one embodiment, the metal layer 502 comprises and/or is plated with Cu, Ni, Ag, Au, Pd, Pt, NiV, NiP, NiNiP, NiP/Pd, Ni/Au, NiP/Pd/Au, or NiP/Pd/AuAg. Still other types of metals/metal alloys and substrates may be used.

A first thin solder preform 204' is applied to a first metal region 208' of the substrate 202. A plurality of first semiconductor dies 200' is soldered to the first metal region 208' of the substrate 202. A soldered joint (out of view) is formed between a metal region (out of view) of each first semiconductor die 200' and the first metal region 208' of the substrate 202 using the first thin solder preform 204' via a diffusion soldering process which does not apply pressure (mechanical) directly to the first semiconductor dies 200'. The first thin solder preform 204' has a maximum thickness of 30 µm and a lower melting point than both the metal region of the first semiconductor dies 200' and the first metal region 208' of the substrate 202.

A second thin solder preform 204" is applied to a second metal region 208" of the substrate 202. A plurality of second semiconductor dies 200" is soldered to the second metal region 208" of the substrate 202. A soldered joint (out of view) is formed between a metal region (out of view) of each second semiconductor die 200" and the second metal region 208" of the substrate 202 using the second thin solder preform 204" via the diffusion soldering process used to solder the plurality of first semiconductor dies 200' to the first metal region 208' of the substrate 202, without applying (mechanical) pressure directly to the second semiconductor dies 200". The second thin solder preform 204" has a maximum thickness of 30 µm and a lower melting point than both the metal region of the second semiconductor dies 200" and the second metal region 208" of the substrate 202.

The first solder preform 204' or the second solder preform 204" may instead be thicker than the other solder preform so that the corresponding soldered joint formed by the thicker solder preform is devoid of intermetallic phases in a middle part of that soldered joint. At thicknesses above 30 µm, a high melting phase is not producible throughout the entire soldered joint formed from the thicker solder preform in a reasonable amount of time, and thus the middle part of the resulting soldered joint will not be converted to an intermetallic compound and will instead remain at the original melting temperature.

Figure 9:
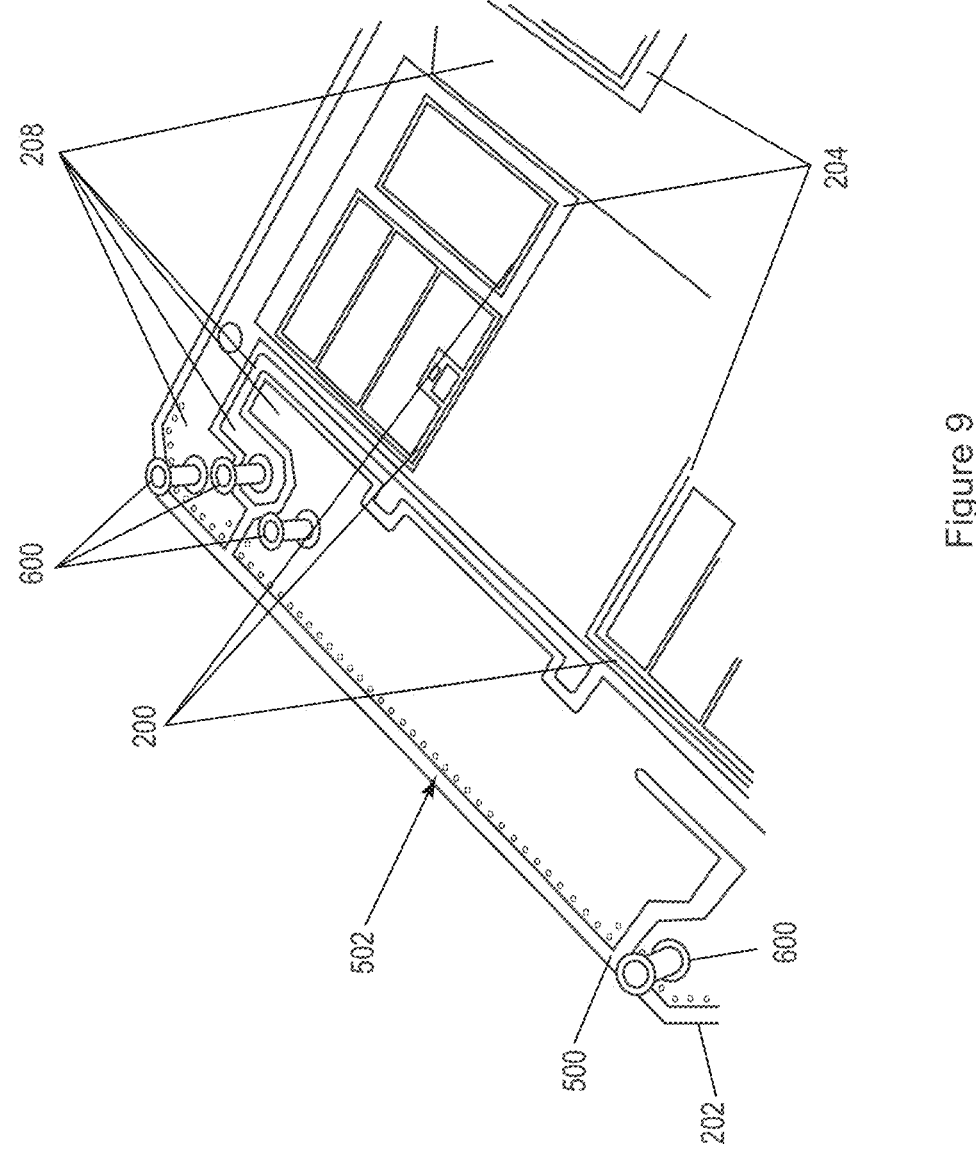

FIG. 9 shows another embodiment of an electronic device in which the substrate 202 has a plurality of metal regions 208 separated from one another. The embodiment illustrated in FIG. 9 is similar to the embodiment illustrated in FIG. 8. In addition, the electronic device also includes one or more connectors 600 such as pins, rivets, metal plates, etc. soldered to the substrate 202 via the batch joining technique described herein, without applying (mechanical) pressure directly to the connector(s) 600. Each connector 600 may be soldered to the substrate 202 by forming a soldered joint (out of view) between the respective connector 600 and the same or different metal region(s) 208 of the substrate 202 to which the semiconductor dies 200 are soldered.

In one embodiment, each connector 600 is soldered to the substrate 202 using the same solder preform as one or more of the semiconductor dies 200 or using a different solder preform, via the same soldering process used to form the soldered joints between the semiconductor dies 200 and the substrate 202 and without applying (mechanical) pressure directly to the connectors 600. If the solder preform has a maximum thickness of 30 µm, a high melting phase results throughout the entire soldered joint formed between the connectors 600 and the substrate 202. If the solder preform is thicker than 30 µm, a high melting phase does not result throughout the entire soldered joint and the middle part of the soldered joint is not converted to an intermetallic compound but instead remains at the original melting temperature of the solder preform.

In another embodiment, each connector 600 is soldered to the substrate 202 by applying a solder paste (not shown) to the connector 600 and/or to the metal region 208 of the substrate 202 to which the connector 600 is to be joined. The solder paste is then reflowed to form a soldered joint between each connector 600 and the corresponding metal region 208 of the substrate 202, without applying (mechanical) pressure directly to the connectors 600.

Figure 10:
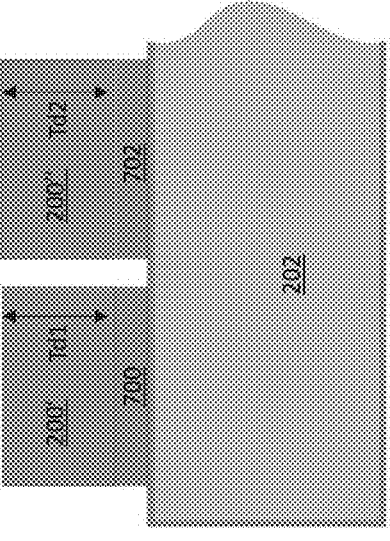

FIG. 10 shows another embodiment of an electronic device in which first and second semiconductor dies 200', 200" of the same height (Td1=Td2) are joined to a substrate 202 by respective soldered joints 700, 702. At least one of the soldered joints 700, 702 is formed from a thin solder preform and therefore has one or more intermetallic phases throughout the entire soldered joint.

Figure 11:
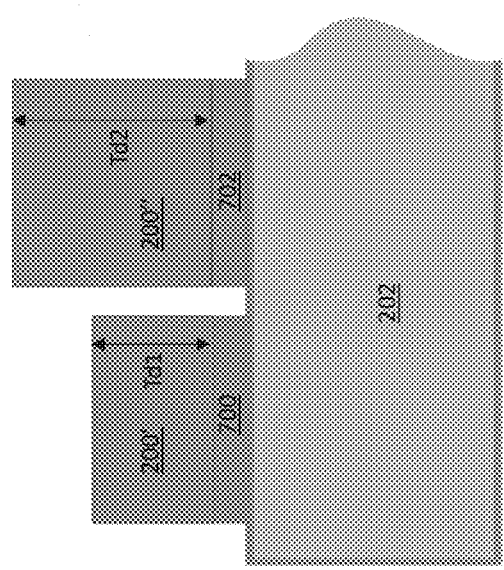

FIG. 11 shows another embodiment of an electronic device produced in accordance with the batch joining technique described herein. The embodiment illustrated in FIG. 11 is similar to the embodiment illustrated in FIG. 10. Different, however, the first and second semiconductor dies 200', 200" have different heights (Td1<Td2). Since the batch joining technique described herein does not apply (mechanical) pressure directly to the components being soldered, semiconductor dies 200', 200" of different heights Td1, Td2 may be processed at the same time without requiring additional equipment for accommodating different height tolerances.

Figure 12:
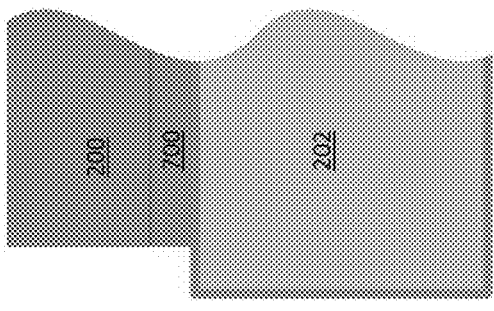

FIG. 12 shows another embodiment of an electronic device produced in accordance with the batch joining technique described herein. According to this embodiment, the soldered joint 700 between the semiconductor die 200 and the substrate 202 is formed from a thin solder preform and therefore has one or more intermetallic phases throughout the entire soldered joint 700. Further according to this embodiment, the soldered joint 700 has the same lateral dimensions (length and width) as the semiconductor die 200 which is joined to the substrate 202 by the soldered joint 700.

Figure 13:
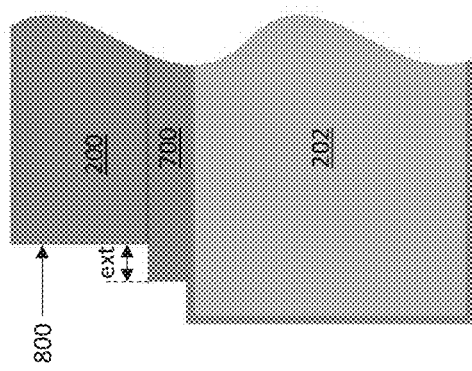

FIG. 13 shows another embodiment of an electronic device produced in accordance with the batch joining technique described herein. The embodiment illustrated in FIG. 13 is similar to the embodiment illustrated in FIG. 12. Different, however, the soldered joint laterally extends ('ext') beyond one or more side faces 800 of the semiconductor die 200. According to this embodiment, the semiconductor die 200 has a smaller footprint than the solder preform used to form the soldered joint between the die 200 and the substrate 202.

Figure 14:
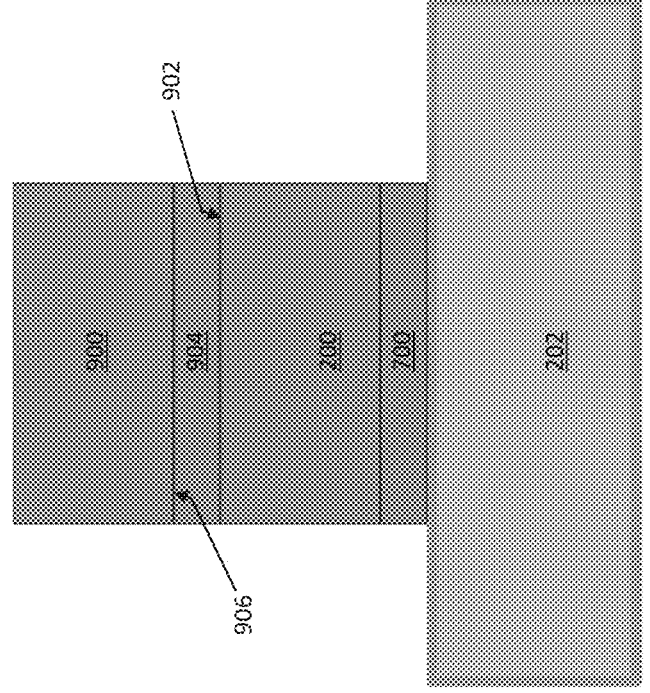

FIG. 14 shows another embodiment of an electronic device produced in accordance with the batch joining technique described herein. According to this embodiment, a first semiconductor die 200 is soldered to a substrate 202 via a first soldered joint 700 and the first soldered joint 700 has one or more intermetallic phases throughout the entire soldered joint 700, each intermetallic phase formed from a solder preform diffused into a metal region of the first semiconductor die 200 and a metal region of the substrate 202. Further according to this embodiment, an additional semiconductor die 900 is soldered to a side 902 of the first semiconductor die 200 facing away from the substrate 202 without applying (mechanical) pressure directly to the additional semiconductor die 900. The soldered joint 904 between the first semiconductor die 200 and the additional semiconductor die 900 may be formed from a solder preform or solder paste.

In the case of a solder preform, the soldered joint 904 between the first semiconductor die 200 and the additional semiconductor die 900 has one or more intermetallic phases. If the solder preform has a maximum thickness of 30 µm, the soldered joint 904 has one or more intermetallic phases throughout the entire first soldered joint 904. Otherwise, the soldered joint 904 is devoid of intermetallic phases in a middle part of the soldered joint 904.

In the case of a solder paste, the soldered joint 904 formed between the first semiconductor die 200 and the additional semiconductor die 900 may be formed by applying a solder paste to a metal region at the side 906 of the additional semiconductor die 900 facing the substrate 202 and/or to a metal region at the side 902 of the first semiconductor die 200 facing away from the substrate 202. The solder paste is then reflowed to form the soldered joint 904 between the first semiconductor die 900 and the additional semiconductor die 200, without applying (mechanical) pressure directly to the additional semiconductor die 900.

Figure 15:
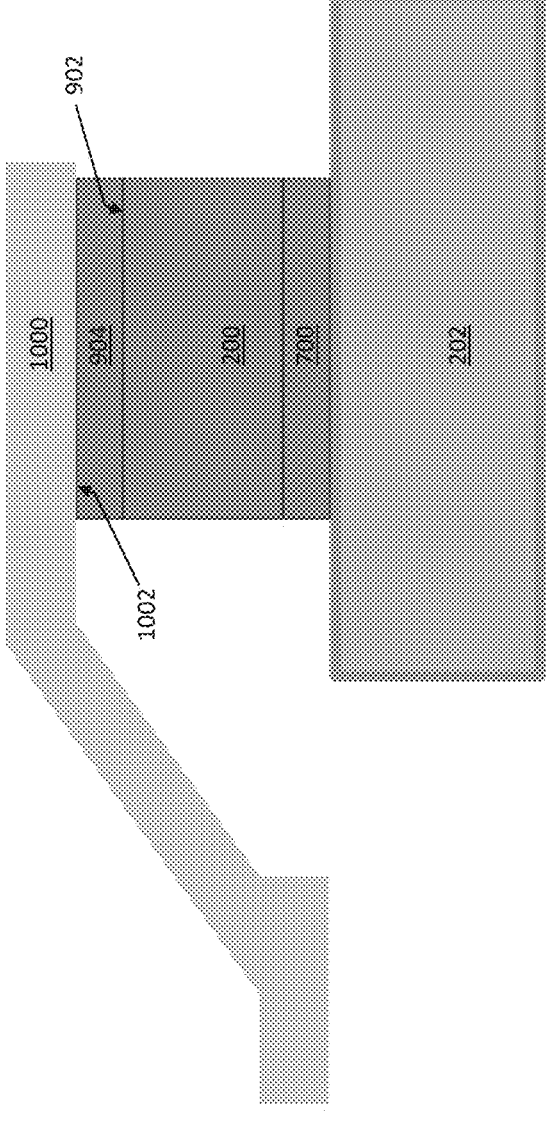

FIG. 15 shows another embodiment of an electronic device produced in accordance with the batch joining technique described herein. The embodiment illustrated in FIG. 15 is similar to the embodiment illustrated in FIG. 14. Different, however, the additional component soldered to the top side 902 of the first semiconductor 200 is a metal clip 1000 instead of an additional semiconductor die 900. The opposite end of the metal clip 1000 may be soldered to the same substrate 202 as the first semiconductor die 200 or to a different substrate (not shown) such as a PCB (printed circuit board). As described above in connection with FIG. 14, the soldered joint 904 between the first semiconductor die 200 and the metal clip 1000 may be formed from a solder preform or solder paste.

In the case of a solder preform, the soldered joint 904 between the first semiconductor die 200 and the metal clip 1000 has one or more intermetallic phases. If the solder preform has a maximum thickness of 30 µm, the soldered joint 904 has one or more intermetallic phases throughout the entire first soldered joint 904. Otherwise, the soldered joint 904 is devoid of intermetallic phases in a middle part of the soldered joint 904.

In the case of a solder paste, the soldered joint 904 formed between the first semiconductor die 200 and the metal clip 1000 may be formed by applying a solder paste to the side 1002 of the metal clip 1000 facing the substrate 202 and/or to a metal region at the side 902 of the first semiconductor die 200 facing away from the substrate 202. The solder paste is then reflowed to form the soldered joint 904 between the metal clip 1000 and the first semiconductor die 200, without applying (mechanical) pressure directly to the metal clip 1000.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic device, comprising:
a first semiconductor die having a metal region;
a substrate comprising a ceramic and a metal layer directly attached to the ceramic, wherein a plurality of metal regions is patterned into the metal layer;
a first soldered joint between the metal region of the first semiconductor die and the metal layer directly attached to the ceramic, the first soldered joint having one or more intermetallic phases throughout the entire soldered joint, each of the one or more intermetallic phases formed from a solder preform diffused into the metal region of the first semiconductor die and the metal layer directly attached to the ceramic, at least one of the intermetallic phases comprising metal consumed from the metal region of the first semiconductor die and at least one of the intermetallic phases comprising metal consumed from the metal layer directly attached to the ceramic, each of the intermetallic phases having a melting point above both a melting point of the solder preform and a soldering temperature at which the solder preform diffused into the metal region of the first semiconductor die and the metal layer directly attached to the ceramic; and
a second semiconductor die soldered to the metal layer directly attached to the ceramic.

2. The electronic device of claim 1, wherein a second soldered joint is formed between a metal region of the second semiconductor die and the metal layer directly attached to the ceramic, and wherein the second soldered joint has one or more intermetallic phases throughout the entire second soldered joint.

3. The electronic device of claim 1, wherein a second soldered joint is formed between a metal region of the second semiconductor die and the metal layer directly attached to the ceramic, and wherein the second soldered joint is devoid of intermetallic phases in a middle part of the second soldered joint.

4. The electronic device of claim 1, wherein a reflowed solder paste forms a second soldered joint between a metal region of the second semiconductor die and the metal layer directly attached to the ceramic.

5. The electronic device of claim 4, wherein the first semiconductor die is a power semiconductor die, and wherein the second semiconductor die is a passive semiconductor die or a logic semiconductor die.

6. The electronic device of claim 1, wherein the first semiconductor die has a different thickness than the second semiconductor die.

7. The electronic device of claim 1, wherein the first soldered joint laterally extends beyond one or more side faces of the first semiconductor die.

8. The electronic device of claim 1, further comprising a connector attached to the metal layer directly attached to the ceramic by:
a soldered joint having one or more intermetallic phases; or
a reflowed solder paste.

9. The electronic device of claim 1, further comprising a third semiconductor die attached to a side of the first or the second semiconductor die facing away from the substrate by:
a soldered joint having one or more intermetallic phases; or
a reflowed solder paste.

10. The electronic device of claim 1, further comprising a metal clip attached to a side of the first or the second semiconductor die facing away from the substrate by:
a soldered joint having one or more intermetallic phases; or
a reflowed solder paste.

11. The electronic device of claim 1, wherein the solder preform has a maximum thickness of 30 μm and a lower melting point than both the metal region of the first semiconductor die and the metal layer directly attached to the ceramic.

12. An electronic device, comprising:
a first semiconductor die having a metal region;
a leadframe or metal clip; and
a first soldered joint between the metal region of the first semiconductor die and the leadframe or metal clip, the first soldered joint having one or more intermetallic phases throughout the entire soldered joint, each of the one or more intermetallic phases formed from a solder preform diffused into the metal region of the first semiconductor die and the leadframe or metal clip, at least one of the intermetallic phases comprising metal consumed from the metal region of the first semiconductor die and at least one of the intermetallic phases comprising metal consumed from the leadframe or metal clip, each of the intermetallic phases having a melting point above both a melting point of the solder preform and a soldering temperature at which the solder preform diffused into the metal region of the first semiconductor die and the leadframe or metal clip.

13. The electronic device of claim 12, wherein the leadframe or metal clip comprises Cu, Ni and/or Ag.

* * * * *